United States Patent
Park

(10) Patent No.: US 12,266,396 B2
(45) Date of Patent: Apr. 1, 2025

(54) INPUT DATA PRE-ALIGNMENT CIRCUIT CAPABLE OF PERFORMING A FIRST-IN FIRST-OUT SIGNAL ALIGNMENT MECHANISM

(71) Applicant: Fujian Jinhua Integrated Circuit Co., Ltd., Quanzhou (CN)

(72) Inventor: Minho Park, Quanzhou (CN)

(73) Assignee: Fujian Jinhua Integrated Circuit Co., Ltd., Quanzhou (CN)

(*) Notice: Subject to any disclaimer, the term of this patent is extended or adjusted under 35 U.S.C. 154(b) by 176 days.

(21) Appl. No.: 18/212,172

(22) Filed: Jun. 20, 2023

(65) Prior Publication Data

US 2024/0331756 A1 Oct. 3, 2024

(30) Foreign Application Priority Data

Mar. 31, 2023 (CN) .......................... 202310334729.1
Mar. 31, 2023 (CN) .......................... 202320686651.5

(51) Int. Cl.
*G11C 11/4076* (2006.01)
*G11C 11/4093* (2006.01)
*G11C 11/4096* (2006.01)

(52) U.S. Cl.
CPC ...... *G11C 11/4076* (2013.01); *G11C 11/4093* (2013.01); *G11C 11/4096* (2013.01)

(58) Field of Classification Search
CPC ............ G11C 11/4076; G11C 11/4093; G11C 11/4096
See application file for complete search history.

(56) References Cited

U.S. PATENT DOCUMENTS

| | | | |
|---|---|---|---|
| 7,817,714 B2 | 10/2010 | Bae | |
| 9,331,646 B2 | 5/2016 | Taylor | |
| 10,348,534 B1 | 7/2019 | Sreeramaneni | |
| 10,496,127 B1* | 12/2019 | Womac | H03L 7/199 |
| 2011/0025382 A1* | 2/2011 | van der Wel | G06F 7/68 |
| | | | 327/156 |
| 2015/0185758 A1* | 7/2015 | Jung | G06F 1/10 |
| | | | 713/502 |
| 2018/0336938 A1* | 11/2018 | Koh | G11C 7/109 |

* cited by examiner

*Primary Examiner* — Min Huang
(74) *Attorney, Agent, or Firm* — Winston Hsu

(57) ABSTRACT

An input data pre-alignment circuit includes a first amplifier, a second amplifier, a clock control unit, a feedback signal generator, and a signal alignment unit. The first amplifier includes a first input terminal for receiving a data signal, a second input terminal for receiving a reference signal, a first output terminal, and a second output terminal. The second amplifier is coupled to the first output terminal of the first amplifier and the second output terminal of the first amplifier. The clock control unit is used for receiving pair-wised clock signals. The feedback signal generator is coupled to the second amplifier and the clock control unit. The signal alignment unit is coupled to the second input terminal of the first amplifier, the first output terminal of the first amplifier, the second output terminal of the first amplifier, and the feedback signal generator.

11 Claims, 5 Drawing Sheets

INPUT DATA PRE-ALIGNMENT CIRCUIT CAPABLE OF PERFORMING A FIRST-IN FIRST-OUT SIGNAL ALIGNMENT MECHANISM

BACKGROUND OF THE INVENTION

1. Field of the Invention

The present invention illustrates an input data pre-alignment circuit, and more particularly, an input data pre-alignment circuit capable of performing a first-in first-out signal alignment mechanism according to a clock signal.

2. Description of the Prior Art

With the rapid development of technology, various volatile and non-volatile memory components are used in computer systems. Dynamic random access memory (DRAM) is a semiconductor memory categorized as a volatile memory. DRAM can use a plurality of charges stored in a capacitor for indicating if a binary bit logic is 1 or 0. DRAM can be regarded as a short-term data storage unit of the computer system. Since DRAM can be used for saving data currently used, the data currently used can be quickly accessed by the computer system.

DRAM can provide high-speed data transmission capability and high bandwidth utilization. However, since the high-speed data transmission capability and high bandwidth utilization of DRAM are required, a signal synchronization function and a signal alignment function are indispensable for the DRAM design, especially in Double-Data-Rate (DDR) 4 and DDR 5 based DRAM applications. Therefore, providing an accurate signal alignment mechanism according to the clock signal is an important design issue.

SUMMARY OF THE INVENTION

In an embodiment of the present invention, an input data pre-alignment circuit is disclosed. The input data pre-alignment circuit comprises a first amplifier, a second amplifier, a clock control unit, a feedback signal generator, and a signal alignment unit. The first amplifier comprises a first input terminal configured to receive a data signal, a second input terminal configured to receive a reference signal, a first output terminal, and a second output terminal. The second amplifier is coupled to the first output terminal of the first amplifier and the second output terminal of the first amplifier. The clock control unit is configured to receive pair-wised clock signals. The feedback signal generator is coupled to the second amplifier and the clock control unit. The signal alignment unit is coupled to the second input terminal of the first amplifier, the first output terminal of the first amplifier, the second output terminal of the first amplifier, and the feedback signal generator.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
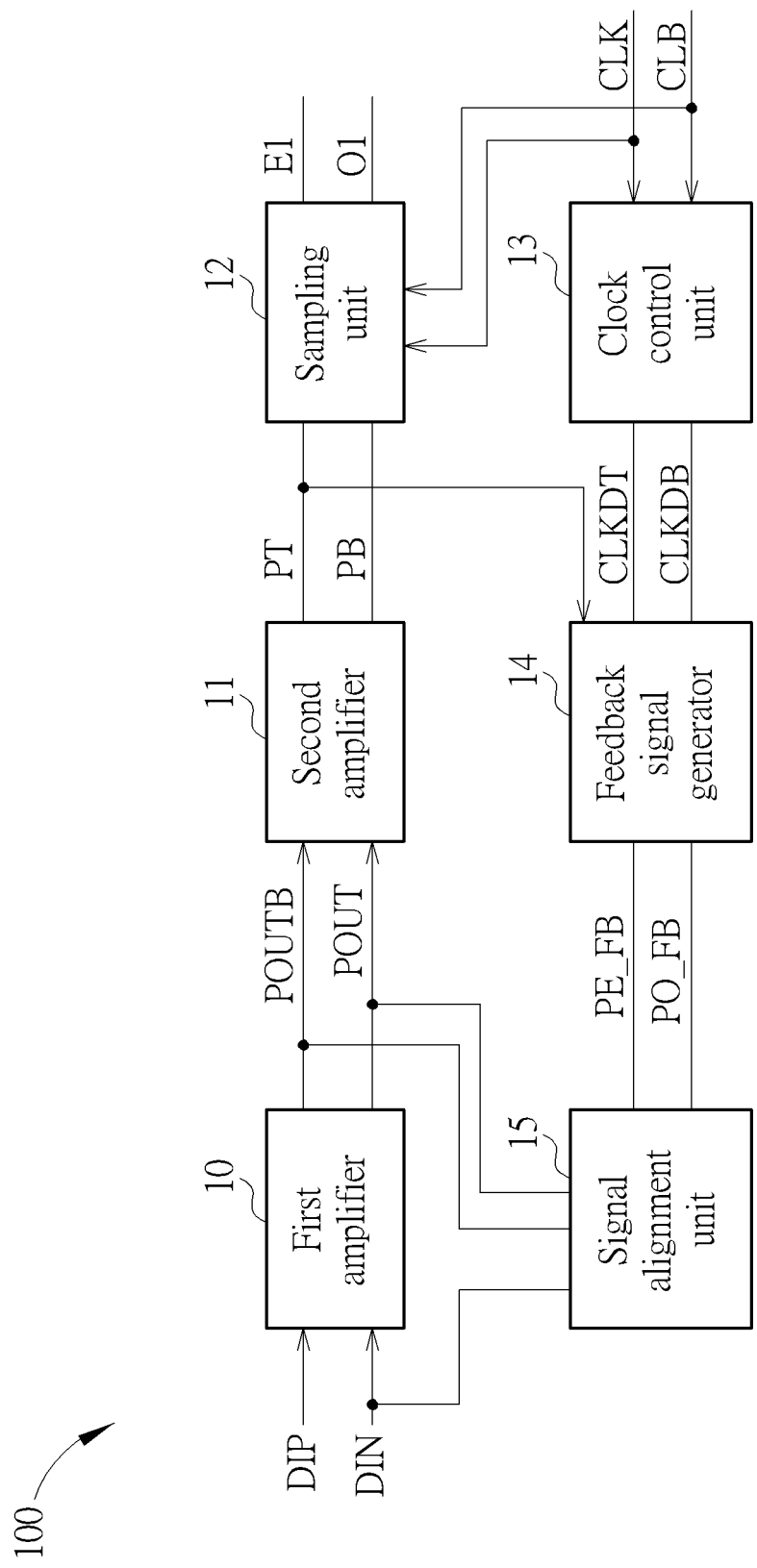
FIG. 1 is an input data pre-alignment circuit according to an embodiment of the present invention.

FIG. 1 is an input data pre-alignment circuit 100 according to an embodiment of the present invention. The input data pre-alignment circuit 100 can accurately align data signals to clock signals according to the data signals and reference signals, thereby performing a first-in first-out (FIFO) signal alignment mechanism during even time slots and odd time slots. The input data pre-alignment circuit 100 includes a first amplifier 10, a second amplifier 11, a clock control unit 13, a feedback signal generator 14, and a signal alignment unit 15. The first amplifier 10 includes a first input terminal, a second input terminal, a first output terminal, and a second output terminal. The first input terminal is used for receiving the data signal DIP. The second input terminal is used for receiving the reference signal DIN. The second amplifier 11 is coupled to the first output terminal of the first amplifier 10 and the second output terminal of the first amplifier 10. The clock control unit 13 is used for receiving pair-wised clock signals (CLK and CLB). The feedback signal generator 14 is coupled to the second amplifier 11 and the clock control unit 13. The signal alignment unit 15 is coupled to the second input terminal of the first amplifier 10, the first output terminal of the first amplifier 10, the second output terminal of the first amplifier 10, and the feedback signal generator 14. In the input data pre-alignment circuit 100, the first amplifier 10, the second amplifier 11, the clock control unit 13, the feedback signal generator 14, and the signal alignment unit 15 form a circuit loop capable of automatically aligning data to the pair-wised clock signals (CLK and CLB) according to the data signal DIP and the reference signal DIN. Further, the input data pre-alignment circuit 100 can comprise a sampling unit 12. The sampling unit 12 is coupled to the second amplifier 11. The sampling unit 12 can generate first data E1 latched at even time indices and second data O1 latched at odd time indices according to a first clock signal CLK, a second clock signal CLB, and dual output signals of the second amplifier 11. For example, a start time point of each slot of the first data E1 latched at even time indices can be a time point of a rising edge of each square waveform of the first clock signal CLK. A start time point of each slot of the second data O1 latched at odd time indices can be a time point of a falling edge of each square waveform of the first clock signal CLK. Circuit details of the input data pre-alignment circuit 100 are illustrated later.

Figure 2:
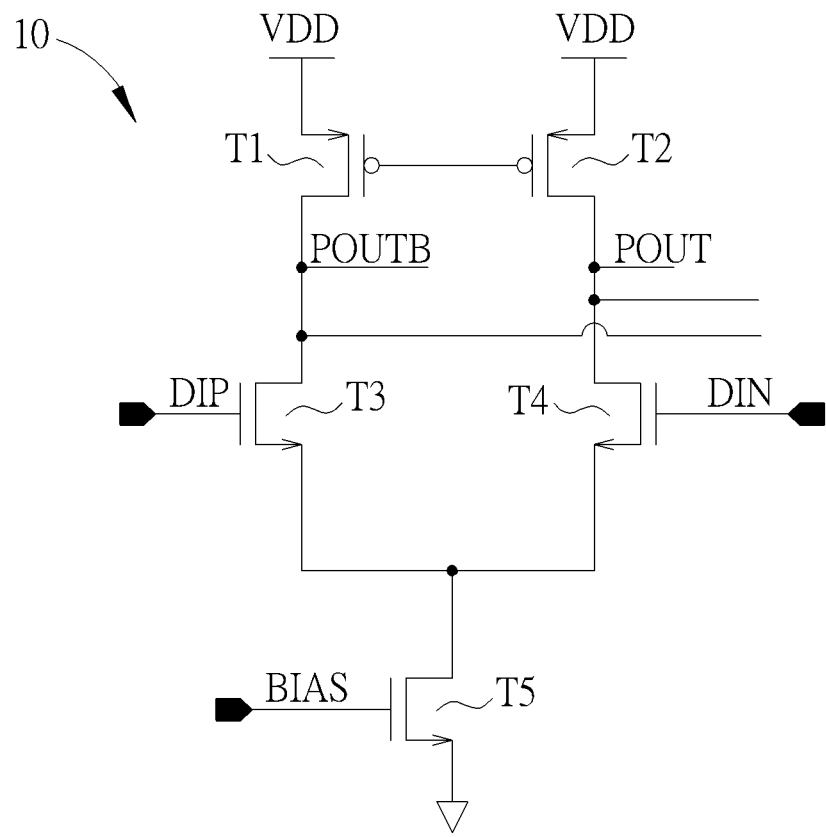
FIG. 2 is a structure of a first amplifier of the input data pre-alignment circuit in FIG. 1.
Figure 3:
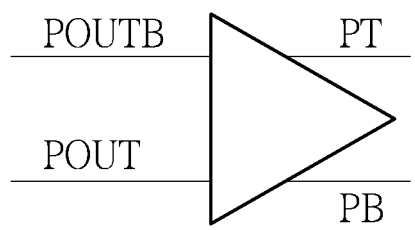
FIG. 3 is a structure of a second amplifier of the input data pre-alignment circuit in FIG. 1.

FIG. 2 is a structure of the first amplifier 10 of the input data pre-alignment circuit 100. FIG. 3 is a structure of the second amplifier 11 of the input data pre-alignment circuit 100. The first amplifier 10 and the second amplifier 11 can be any type of amplifier. For example, the first amplifier 10 and the second amplifier 11 can be voltage amplifiers, current amplifiers, or differential amplifiers. In FIG. 2, the first amplifier 10 can be a differential amplifier. The first amplifier 10 can include a first transistor T1, a second transistor T2, a third transistor T3, a fourth transistor T4, and a fifth transistor T5. The first transistor T1 includes a first terminal for receiving a working voltage VDD, a second terminal, and a control terminal. The second transistor T2 includes a first terminal for receiving the working voltage VDD, a second terminal, and a control terminal coupled to the control terminal of the first transistor T1. The third transistor T3 includes a first terminal coupled to the second terminal of the first transistor T1, a second terminal, and a control terminal for receiving the data signal DIP. The fourth transistor T4 includes a first terminal coupled to the second terminal of the second transistor T2, a second terminal coupled to the second terminal of the third transistor T3, and a control terminal for receiving the reference signal DIN. The fifth transistor T5 includes a first terminal coupled to the second terminal of the fourth transistor T4, a second terminal coupled to a ground terminal, and a control terminal for receiving a biased voltage signal BIAS. Here, the first transistor T1 and the second transistor T2 can be P-type Metal-Oxide-Semiconductor Field Effect Transistors (PMOSFETs). The third transistor T3, the fourth transistor T4, and the fifth transistor T5 can be N-type Metal-Oxide-Semiconductor Field Effect Transistors (NMOSFETs). The biased voltage signal BIAS can be a customized or predetermined voltage signal for controlling a conduction state of the fifth transistor T5. Therefore, a current of the fifth transistor T5 can be controlled by the biased voltage signal BIAS. Further, when the third transistor T3 and the fourth transistor T4 are operated in a linear region and the first transistor T1 and the second transistor T2 are enabled, two outputs of the first amplifier 10 (i.e., the first output signal POUTB and the second output signal POUT) can be linearly amplified according to the data signal DIP and the reference signal DIN. Particularly, the first output signal POUTB is at the first terminal of the third transistor T3. The second output signal POUT is at the first terminal of the fourth transistor T4. Further, the first output signal POUTB and the second output signal POUT are complementary. In FIG. 3, the second amplifier 11 can be a differential amplifier. The first output signal POUTB and the second output signal POUT of the first amplifier 10 are inputted to the second amplifier 11. The second amplifier 11 includes a first input terminal coupled to the first output terminal of the first amplifier 10, a second input terminal coupled to the second output terminal of the first amplifier 10, a first output terminal coupled to the feedback signal generator 14, and a second output terminal. Therefore, the first output signal POUTB and the second output signal POUT can be amplified to generate the third output signal PT and the fourth output signal PB by the second amplifier 11. The third output signal PT is outputted from the first output terminal of the second amplifier 11. The fourth output signal PB is outputted from the second output terminal of the second amplifier 11. Further, the third output signal PT and the fourth output signal PB are complementary.

Figure 4:
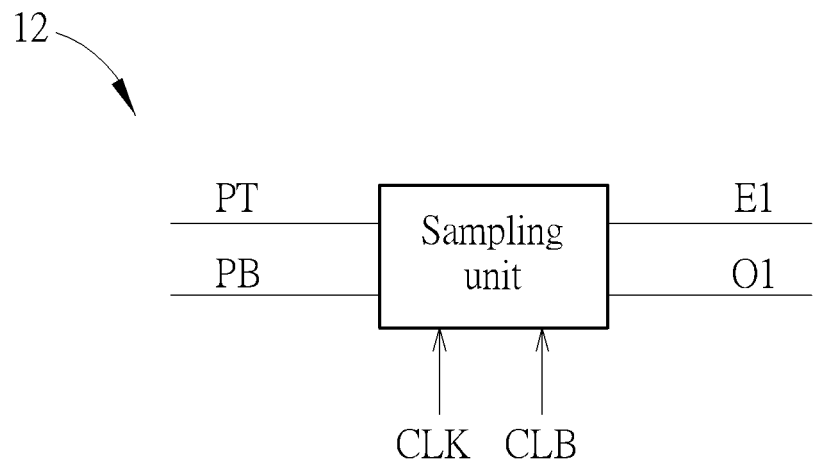
FIG. 4 is a structure of a sampling unit of the input data pre-alignment circuit in FIG. 1.

FIG. 4 is a structure of the sampling unit 12 of the input data pre-alignment circuit 100. The sampling unit 12 includes a first input terminal, a second input terminal, a third input terminal, a fourth input terminal, a first output terminal, and a second output terminal. The first input terminal is coupled to the first output terminal of the second amplifier 11. The second input terminal is coupled to the second output terminal of the second amplifier 11. The third input terminal is used for receiving the first clock signal CLK. The fourth input terminal is used for receiving the second clock signal CLB. In other words, the pair-wised clock signals include the first clock signal CLK and the second clock signal CLB. The first clock signal CLK and the second clock signal CLB are complementary. The first output terminal is used for outputting the first data E1 latched at even time indices. The second output terminal is used for outputting the second data O1 latched at odd time indices. The sampling unit 12 can be implemented by any reasonable circuit. For example, the sampling unit 12 can include a sampling switch. The sampling switch can sample the amplified data signal DIP when square waveforms of the first clock signal CLK are at the rising edge. As a result, the first data E1 latched at even time indices can be generated. Similarly, the sampling switch can sample the amplified data signal DIP when square waveforms of the first clock signal CLK are at the falling edge. As a result, the second data O1 latched at odd time indices can be generated. Here, the first clock signal CLK includes a plurality of square waveforms. The time duration from the rising edge of a square waveform to a next rising edge of a next square waveform can be defined as a period. Specifically, a length of the period is twice the width of the square waveform. Therefore, the first data E1 of each time slot is latched during one period (i.e., twice the width of the square waveform). As a result, the time indices of the first data E1 can be written as $\{0, 2, 4, 6, \ldots\}$. Similarly, the time duration from the falling edge of the square waveform to the next falling edge of the next square waveform can be defined as the period. Specifically, the length of the period is twice the width of the square waveform. Therefore, the second data O1 of each time slot is latched during one period (i.e., twice the width of the square waveform). As a result, the time indices of the second data O1 can be written as $\{1, 3, 5, 7, \ldots\}$.

Figure 5:
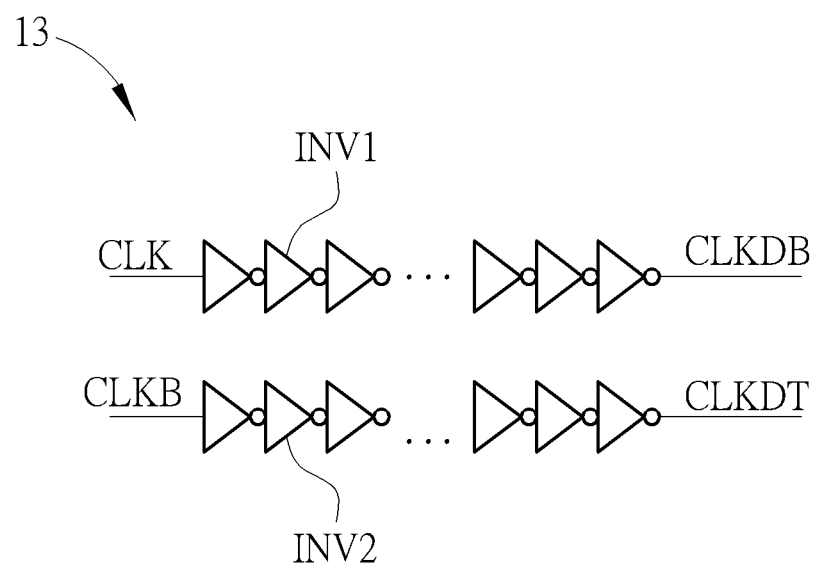
FIG. 5 is a structure of a clock control unit of the input data pre-alignment circuit in FIG. 1.

FIG. 5 is a structure of the clock control unit 13 of the input data pre-alignment circuit 100. The clock control unit 13 includes a plurality of first inverters INV1 and a plurality of second inverters INV2. The plurality of first inverters INV1 are used for receiving the first clock signal CLK and outputting the first clock delay signal CLKDB. The plurality of second inverters INV2 are used for receiving the second clock signal CLKB and outputting the second clock delay signal CLKDT. Further, the first clock signal CLK and the second clock signal CLKB are pair-wised clock signals. The first clock signal CLK and the second clock signal CLKB are complementary.

Similarly, the second inverters INV2 connected in series can delay the second clock signal CLKB for outputting the second clock delay signal CLKDT. As shown in FIG. 5, the number of the first inverters INV1 and the number of the second inverters INV2 of the clock control unit 13 are not limited. Further, since each inverter has its time delay, the more inverters used in the clock control unit 13, the greater time delay is introduced. Further, when the number of the first inverters INV and the number of second inverters INV2 are identical, the first clock delay signal CKLDB and the second clock delay signal CLKDT are complementary.

Figure 6:
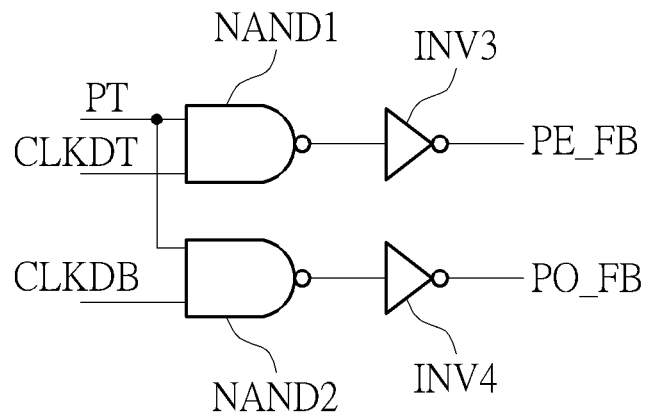
FIG. 6 is a structure of a feedback signal generator of the input data pre-alignment circuit in FIG. 1.

FIG. 6 is a structure of the feedback signal generator 14 of the input data pre-alignment circuit 100. The feedback signal generator 14 includes a first NAND gate NAND1, a third inverter INV3, a second NAND gate NAND2, and a fourth inverter INV4. The first NAND gate NAND1 includes a first input terminal, a second input terminal, and an output terminal. The first input terminal is coupled to the first output terminal of the second amplifier 11 for receiving the third output signal PT. The second input terminal is used for receiving the second clock delay signal CLKDT. The third inverter INV3 includes an input terminal and an output terminal. The input terminal is coupled to the output terminal of the first NAND gate NAND1. The output terminal is used for outputting a first feedback signal PE_FB. The second NAND gate NAND2 includes a first input terminal and a second input terminal. The first input terminal is coupled to the first input terminal of the first NAND gate NAND1 for receiving the third output signal PT. The second input terminal is used for receiving the first clock delay signal CLKDB. The fourth inverter INV4 includes an input terminal and an output terminal. The input terminal is coupled to the output terminal of the second NAND gate NAND2. The output terminal is used for outputting a second feedback signal PO_FB. Operations of the feedback signal generator 14 are illustrated below. As shown in FIG. 6, when the data signal DIP is latched at even time indices {0,2,4,6, . . . }. The second clock delay signal CLKDT is at a high voltage. The first clock delay signal CLKDB is at a low voltage. Therefore, when the third output signal PT includes valid data (i.e., at a high voltage), both input terminals of the first NAND gate NAND1 are at high voltages. Therefore, the output terminal of the first NAND gate NAND1 is at a low voltage.

Finally, the third inverter INV3 can output the first feedback signal PE_FB having a high voltage. The two input terminals of the second NAND gate NAND2 are respectively at a high voltage (PT) and a low voltage (CLKDB). Therefore, the output terminal of the second NAND gate NAND2 is at a high voltage. Finally, the fourth inverter INV4 can output the second feedback signal PO_FB with a low voltage. Similarly, when the data signal DIP is latched at odd time indices {1,3,5,7 . . . }. The second clock delay signal CLKDT is at a low voltage. The first clock delay signal CLKDB is at a high voltage. Therefore, when the third output signal PT includes valid data (i.e., at a high voltage), two input terminals of the first NAND gate NAND1 are respectively at a high voltage (PT) and a low voltage (CLKDT). Therefore, the output terminal of the first NAND gate NAND1 is at a high voltage. Finally, the third inverter INV3 can output the first feedback signal PE_FB having a low voltage. Further, both input terminals of the second NAND gate NAND2 are at high voltages. Therefore, the output terminal of the second NAND gate NAND2 is at a low voltage. Finally, the fourth inverter INV4 can output the second feedback signal PO_FB having a high voltage. By using operations of the feedback signal generator 14, when the time indices are {1,3,5,7 . . . }, the second feedback signal PO_FB corresponding to odd time indices is at a high voltage. The first feedback signal PE_FB corresponding to even time indices is at a low voltage. Further, when the time indices are {0,2,4,6 . . . }, the second feedback signal PO_FB corresponding to odd time indices is at a low voltage. The first feedback signal PE_FB corresponding to even time indices is at a high voltage.

Figure 7:
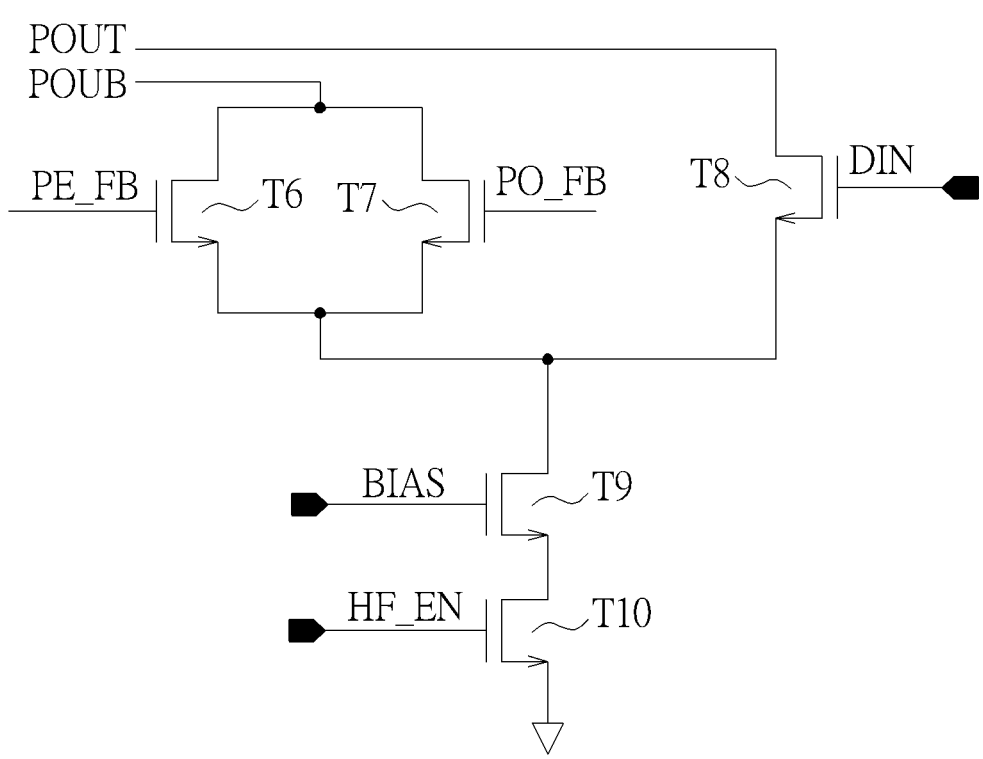
FIG. 7 is a structure of a signal alignment unit of the input data pre-alignment circuit in FIG. 1.

FIG. 7 is a structure of the signal alignment unit 15 of the input data pre-alignment circuit 100. The signal alignment unit 15 includes a sixth transistor T6, a seventh transistor T7, an eighth transistor T8, a ninth transistor T9, and a tenth transistor T10. The sixth transistor T6 includes a first terminal coupled to the first output terminal of the first amplifier 10, a control terminal coupled to the output terminal of the third inverter INV3 for receiving the first feedback signal PE_FB, and a second terminal. The seventh transistor T7 includes a first terminal coupled to the first output terminal of the first amplifier 10, a control terminal for receiving the second feedback signal PO_FB, and a second terminal coupled to the second terminal of the sixth transistor T6. The eighth transistor T8 includes a first terminal coupled to the second output terminal of the first amplifier 10, a control terminal for receiving the reference signal DIN, and a second terminal coupled to the second terminal of the sixth transistor T6. The ninth transistor T9 includes a first terminal coupled to the second terminal of the sixth transistor T6, a control terminal for receiving the biased voltage signal BIAS, and a second terminal. The tenth transistor T10 includes a first terminal coupled to the second terminal of the ninth transistor T9, a control terminal for receiving an enabling signal HF_EN, and a second terminal coupled to a ground terminal. In the signal alignment unit 15, the sixth transistor T6, the seventh transistor T7, the eighth transistor T8, the ninth transistor T9, and the tenth transistor T10 are N-type Metal-Oxide-Semiconductor Field Effect Transistors. The enabling signal HF_EN can be regarded as a switch signal of the signal alignment unit 15. For example, if the enabling signal HF_EN is at a low voltage, the tenth transistor T10 is disabled. As a result, no current is transmitted to the tenth transistor T10. If the enabling signal HF_EN is at a high voltage, the tenth transistor T10 is enabled. Therefore, the signal alignment unit 15 can be operated according to the biased voltage signal BIAS, the first feedback signal PE_FB, the second feedback signal PO_FB and the reference signal DIN, as illustrated below.

As previously mentioned, when the time indices of the data signal DIP are {1,3,5,7, . . . }, the second feedback signal PO_FB corresponding to the odd time indices is at a high voltage. The first feedback signal PE_FB corresponding to the even time indices is at a low voltage. Therefore, the control terminal of the sixth transistor T6 is at a low voltage (PE_FB). The sixth transistor T6 is disabled. The control terminal of the seventh transistor T7 is at a high voltage (PO_FB). The seventh transistor T7 is enabled. Since the first output signal POUTB and the second output signal POUT are complementary, a current of the sixth transistor T6 or the seventh transistor T7 can be generated. Since the sixth transistor T6 is disabled and the seventh transistor T7 is enabled, a current of the seventh transistor T7 is generated. In other words, for the odd time indices {1,3,5,7, . . . }, the input data pre-alignment circuit 100 can use the seventh transistor T7 of the signal alignment unit 15 for latching the amplified data signal DIP (i.e., the amplified data signal DIP includes the first output signal POUTB and the second output signal POUT) according to the first clock signal CLK. As a result, the data signal DIP latched at the odd time indices {1,3,5,7 . . . } can be aligned to the first clock signal CLK. Similarly, when the time indices of the data signal DIP are {0,2,4,6, . . . }, the first feedback signal PE_FB corresponding to the even time indices is at a high voltage. The second feedback signal PO_FB corresponding to the odd time indices is at a low voltage. Therefore, the control terminal of the sixth transistor T6 is at a high voltage (PE_FB). The sixth transistor T6 is enabled. The control terminal of the seventh transistor T7 is at a low voltage (PO_FB). The seventh transistor T7 is disabled. Since the first output signal POUTB and the second output signal POUT are complementary, the current of the sixth transistor T6 or the seventh transistor T7 can be generated. Since the sixth transistor T6 is enabled and the seventh transistor T7 is disabled, a current of the sixth transistor T6 is generated. In other words, for the even time indices {0,2,4, 6, . . . }, the input data pre-alignment circuit 100 can use the sixth transistor T6 of the signal alignment unit 15 for latching the amplified data signal DIP (i.e., the amplified data signal DIP includes the first output signal POUTB and the second output signal POUT) according to the first clock signal CLK. As a result, the data signal DIP latched at the even time indices {0,2,4,6, . . . } can be aligned to the first clock signal CLK. Further, since the biased voltage signal BIAS controls the conduction state of the ninth transistor T9, a part of current between the sixth transistor T6 (or the seventh transistor T7) and the eighth transistor T8 can be transmitted to the ground terminal through the ninth transistor T9 and the tenth transistor T10. As a result, the signal alignment unit 15 can adjust a power gain of the first output signal POUTB and the second output signal POUT.

Figure 8:
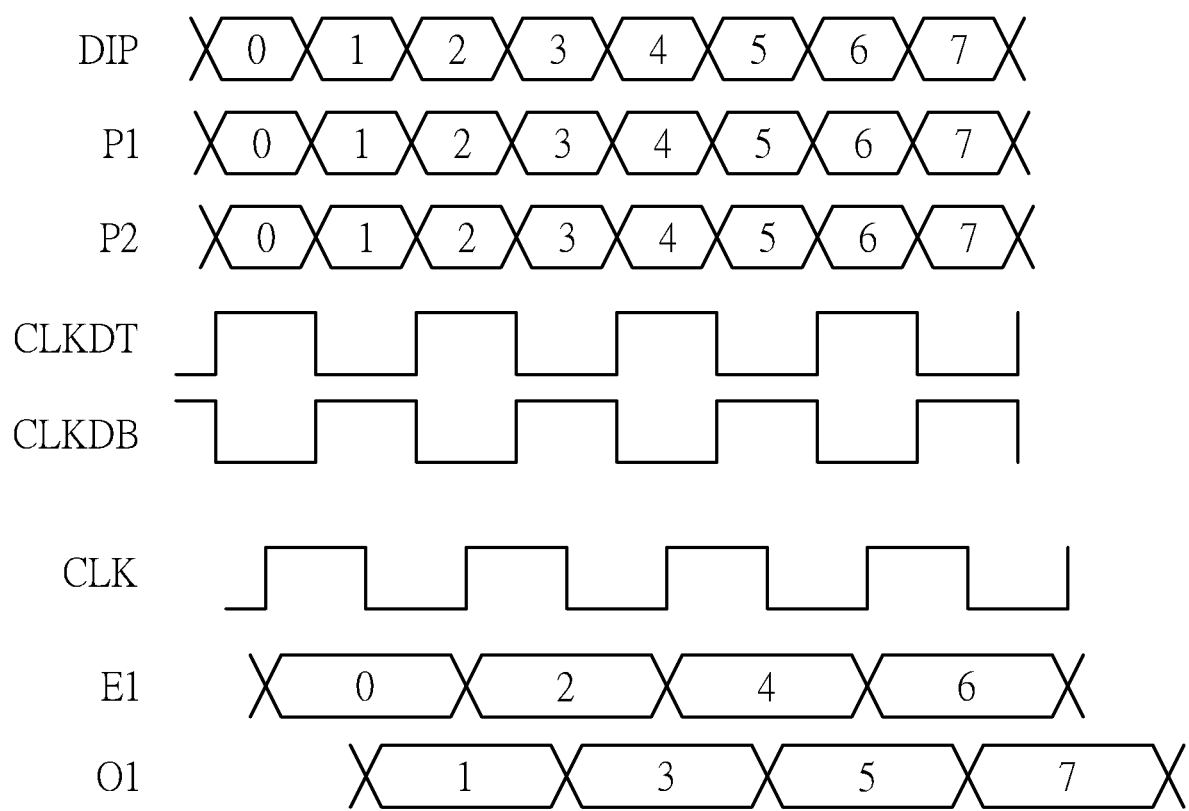
FIG. 8 is an illustration of waveforms of signals of the input data pre-alignment circuit in FIG. 1.

FIG. 8 is an illustration of waveforms of signals of the input data pre-alignment circuit 100. As previously mentioned, the time indices of the data signal DIP can be expressed as $\{0, 1, 2, 3, 4, 5, 6, 7, \ldots\}$. An output phase waveform P1 of the first amplifier 10 is similar to the data signal DIP with introducing a slight delay. An output phase waveform P2 of the second amplifier 11 is similar to the output phase waveform P1 of the first amplifier 10 with introducing a slight delay. The first clock delay signal CLKDB and the second clock delay signal CLKDT are complementary. The first clock signal CLK includes a plurality of square waveforms. As previously mentioned, when the time indices of the data signal DIP are $\{0,2,4,6,\ldots\}$, the input data pre-alignment circuit 100 can use the signal alignment unit 15 to latch the first data E1 according to the first clock signal CLK. Therefore, the data signal DIP latched at even time indices $\{0,2,4,6,\ldots\}$ can be aligned with the first clock signal CLK. Further, the first clock signal CLK includes a plurality of square waves. The time duration from the rising edge of a square waveform to a next rising edge of a next square waveform can be defined as a period. Specifically, a length of the period is twice the width of the square waveform. Therefore, the first data E1 of each time slot is latched during one period (i.e., twice the width of the square waveform). As a result, the time indices of the first data E1 can be written as $\{0,2,4,6,\ldots\}$. Similarly, when the time indices of the data signal DIP are $\{1,3,5,7,\ldots\}$, the input data pre-alignment circuit 100 can use the signal alignment unit 15 to latch the second data O1 according to the first clock signal CLK. Therefore, the data signal DIP latched at odd time indices $\{1,3,5,7,\ldots\}$ can be aligned with the first clock signal CLK. As previously mentioned, the first clock signal CLK includes a plurality of square waves. Therefore, the time duration from the falling edge of the square waveform to the next falling edge of the next square waveform can be defined as the period. The length of the period is twice the width of the square waveform. Therefore, the second data O1 of each time slot is latched during one period (i.e., twice the width of the square waveform). As a result, the time indices of the second data O1 can be written as $\{1,3,5,7,\ldots\}$.

To sum up, the present invention discloses an input data pre-alignment circuit. The input data pre-alignment circuit can be applied to the dynamic random access memory for performing a data alignment process. The input data pre-alignment circuit can use the signal alignment unit for latching the data signal at odd time indices and even time indices by using different transistors. Therefore, a high-speed signal alignment mechanism of the dynamic random access memory can be performed. Further, the input data pre-alignment circuit introduces a sampling unit. The sampling unit can separate the data signal into first data latched at even time indices and second data latched at odd time indices. As a result, the first data latched at even time indices and the second data latched at odd time indices can be generated according to a first-in first-out (FIFO) signal alignment mechanism.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An input data pre-alignment circuit comprising:
   a first amplifier comprising:
      a first input terminal configured to receive a data signal;
      a second input terminal configured to receive a reference signal;
      a first output terminal; and
      a second output terminal;
   a second amplifier coupled to the first output terminal of the first amplifier and the second output terminal of the first amplifier;
   a clock control unit configured to receive pair-wised clock signals;
   a feedback signal generator coupled to the second amplifier and the clock control unit; and
   a signal alignment unit coupled to the second input terminal of the first amplifier, the first output terminal of the first amplifier, the second output terminal of the first amplifier, and the feedback signal generator.

2. The input data pre-alignment circuit of claim 1, wherein the first amplifier further comprises:
   a first transistor comprising:
      a first terminal configured to receive a working voltage;
      a second terminal; and
      a control terminal;
   a second transistor comprising:
      a first terminal configured to receive the working voltage;
      a second terminal; and
      a control terminal coupled to the control terminal of the first transistor;
   a third transistor comprising:
      a first terminal coupled to the second terminal of the first transistor;
      a second terminal; and
      a control terminal configured to receive the data signal;
   a fourth transistor comprising:
      a first terminal coupled to the second terminal of the second transistor;
      a second terminal coupled to the second terminal of the third transistor; and
      a control terminal configured to receive the reference signal; and
   a fifth transistor comprising:
      a first terminal coupled to the second terminal of the fourth transistor;
      a second terminal coupled to a ground terminal; and
      a control terminal configured to receive a biased voltage signal.

3. The input data pre-alignment circuit of claim 2, wherein the first transistor and the second transistor are P-type Metal-Oxide-Semiconductor Field Effect Transistors, the third transistor, the fourth transistor, and the fifth transistor are N-type Metal-Oxide-Semiconductor Field Effect Transistors.

4. The input data pre-alignment circuit of claim 1, wherein the second amplifier comprises:
   a first input terminal coupled to the first output terminal of the first amplifier;
   a second input terminal coupled to the second output terminal of the first amplifier;
   a first output terminal; and
   a second output terminal.

5. The input data pre-alignment circuit of claim 1 further comprising:
- a sampling unit coupled to the second amplifier, the sampling unit comprising:
  - a first input terminal coupled to the first output terminal of the second amplifier;
  - a second input terminal coupled to the second output terminal of the second amplifier;
  - a third input terminal configured to receive a first clock signal;
  - a fourth input terminal configured to receive a second clock signal;
  - a first output terminal configured to output first data latched at even time indices; and
  - a second output terminal configured to output second data latched at odd time indices;
- wherein the pair-wised clock signals comprise the first clock signal and the second clock signal, and the first clock signal and the second clock signal are complementary.

6. The input data pre-alignment circuit of claim 1, wherein the clock control unit comprises:
- a plurality of first inverters configured to receive a first clock signal and output a first clock delay signal; and
- a plurality of second inverters configured to receive a second clock signal and output a second clock delay signal;
- wherein the pair-wised clock signals comprise the first clock signal and the second clock signal, the first clock signal and the second clock signal are complementary, and the first clock delay signal and the second clock delay signal are complementary.

7. The input data pre-alignment circuit of claim 6, wherein the feedback signal generator comprises:
- a first NAND gate comprising:
  - a first input terminal coupled to the first output terminal of the second amplifier;
  - a second input terminal configured to receive the second clock delay signal; and
  - an output terminal;
- a third inverter comprising:
  - an input terminal coupled to the output terminal of the first NAND gate; and
  - an output terminal;
- a second NAND gate comprising:
  - a first input terminal coupled to the first input terminal of the first NAND gate; and
  - a second input terminal configured to receive the first clock delay signal; and
- a fourth inverter comprising:
  - an input terminal coupled to the output terminal of the second NAND gate; and
  - an output terminal.

8. The input data pre-alignment circuit of claim 7, wherein the signal alignment unit comprises:
- a sixth transistor comprising:
  - a first terminal coupled to the first output terminal of the first amplifier;
  - a control terminal coupled to the output terminal of the third inverter; and
  - a second terminal;
- a seventh transistor comprising:
  - a first terminal coupled to the first output terminal of the first amplifier;
  - a control terminal coupled to the output terminal of the fourth inverter; and
  - a second terminal coupled to the second terminal of the sixth transistor;
- an eighth transistor comprising:
  - a first terminal coupled to the second output terminal of the first amplifier;
  - a control terminal configured to receive the reference signal; and
  - a second terminal coupled to the second terminal of the sixth transistor;
- a ninth transistor comprising:
  - a first terminal coupled to the second terminal of the sixth transistor;
  - a control terminal configured to receive a biased voltage signal; and
  - a second terminal; and
- a tenth transistor comprising:
  - a first terminal coupled to the second terminal of the ninth transistor;
  - a control terminal configured to receive an enabling signal; and
  - a second terminal.

9. The input data pre-alignment circuit of claim 8, wherein when the data signal is latched at even time indices, the control terminal of the sixth transistor is at a high voltage, the sixth transistor is enabled, the control terminal of the seventh transistor is at a low voltage, and seventh transistor is disabled.

10. The input data pre-alignment circuit of claim 8, wherein when the data signal is latched at odd time indices, the control terminal of the sixth transistor is at a low voltage, the sixth transistor is disabled, the control terminal of the seventh transistor is at a high voltage, and seventh transistor is enabled.

11. The input data pre-alignment circuit of claim 8, wherein the sixth transistor, the seventh transistor, the eighth transistor, the ninth transistor, and the tenth transistor are N-type Metal-Oxide-Semiconductor Field Effect Transistors.

* * * * *